United States Patent
Yang (10) Patent No.: US 7,405,938 B2
(45) Date of Patent: Jul. 29, 2008

(54) HEAT SINK CLIP

(75) Inventor: Chih-Hao Yang, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 42 days.

(21) Appl. No.: 11/565,500

(22) Filed: Nov. 30, 2006

(65) Prior Publication Data

US 2008/0130238 A1 Jun. 5, 2008

(51) Int. Cl.
*H05K 7/20* (2006.01)
*F28F 7/00* (2006.01)
*H01L 23/34* (2006.01)

(52) U.S. Cl. .................. 361/719; 165/80.3; 165/185; 24/457; 24/458; 361/704; 361/707; 257/718; 257/719; 411/508; 248/505; 248/510

(58) Field of Classification Search ......... 257/718–719; 361/719–720; 411/508
See application file for complete search history.

(56) References Cited

U.S. PATENT DOCUMENTS

| | | | |
|---|---|---|---|
| 5,384,940 A * | 1/1995 | Soule et al. | 24/453 |
| 5,730,210 A * | 3/1998 | Kou | 165/80.3 |
| 5,978,223 A * | 11/1999 | Hamilton et al. | 361/704 |
| 6,307,748 B1 * | 10/2001 | Lin et al. | 361/704 |
| 6,331,937 B1 * | 12/2001 | Bartyzel | 361/687 |
| 6,666,640 B1 * | 12/2003 | Hsieh | 411/508 |
| 7,116,556 B2 * | 10/2006 | Lee et al. | 361/704 |
| 7,126,823 B2 * | 10/2006 | Chen et al. | 361/702 |
| 7,164,583 B2 * | 1/2007 | Lee et al. | 361/704 |
| 7,193,849 B2 * | 3/2007 | Xu et al. | 361/695 |

* cited by examiner

Primary Examiner—Gregory D Thompson (57) ABSTRACT

A heat sink assembly (100) and a heat sink clip (20) are provided. The heat sink clip (20) includes a pin (22) and a spring (24) disposed around the pin (22). The pin (22) includes an upper section (22a) and a lower section (22b). The upper section (22a) has a head (222) thereon, and the lower section (22a) has a clamping portion (224) and an abutting portion (226) which is located between the head (222) and the clamping portion (224) and is in the form of an annular flange extending radially outwardly from an outer surface of the pin (22). A plurality of slots (22c) are defined through the clamping portion (224) and the lower section (22b) of the pin. The abutting portion (226) engages with a bottom surface of a heat sink (10) before the clip (20) secures the heat sink assembly (100) to a circuit board (40).

16 Claims, 9 Drawing Sheets

FIG. 9

HEAT SINK CLIP

BACKGROUND OF THE INVENTION

1. Field of the Invention

The present invention relates generally to a clip, and more specifically to a heat sink clip for securing a heat sink to a heat generating electronic unit to remove heat from the electronic unit.

2. Description of Related Art

With the continuing development of computer technology, electronic components such as central processing units (CPUs) of computers are being made to operate at higher operational speeds and to have greater functional capabilities. When a CPU operates at high speed in a computer enclosure, its temperature increases rapidly. To avoid damage to the CPU, heat generated by the CPU must be dissipated quickly, which can be done by, for example, using a heat sink attached to a surface of the CPU to absorb the heat from the CPU. The heat absorbed by the heat sink is then dissipated to ambient air.

To secure the heat sink to the heat generating electronic device, a heat sink clip is required. A currently available heat sink clip is disclosed in U.S. Pat. No. 5,384,940. The clip comprises an elongated pin and a coil spring, wherein the spring is disposed around the pin. The pin passes through aligned holes defined in a heat sink and a printed circuit board thereby attaching the heat sink to an electronic device mounted on the printed circuit board.

However, before the clip and the heat sink are secured to the printed circuit board, the clip is separated from and not tied to the heat sink. In other words, the clip is not preassembled to the heat sink beforehand. Thus, it is difficult for the clip to be manipulated manually to align with the holes of the heat sink and the printed circuit board. Furthermore, having the clip and the heat sink in separate parts also increases the shipment cost when the clip and the heat sink are commercially marketed.

Therefore, an improved heat sink clip which can overcome the above problems is desired.

SUMMARY OF THE INVENTION

The present invention relates to a heat sink clip. In accordance with an embodiment, the heat sink clip comprises a pin having an upper section and a lower section; a spring is disposed around the pin; the upper section of the pin has a head thereon, the lower section of the pin has a clamping portion thereon, and an abutting portion is formed between the head and the clamping portion. The spring is located between the head and the abutting portion, the abutting portion is in the form of an annular flange extending radially outwardly from an outer surface of the pin, and a plurality of slots are defined through the clamping portion and the lower section of the pin.

Other advantages and novel features of the present invention can be drawn from the following detailed description of a preferred embodiment of the present invention, in which:

DETAILED DESCRIPTION OF THE INVENTION

Figure 1:
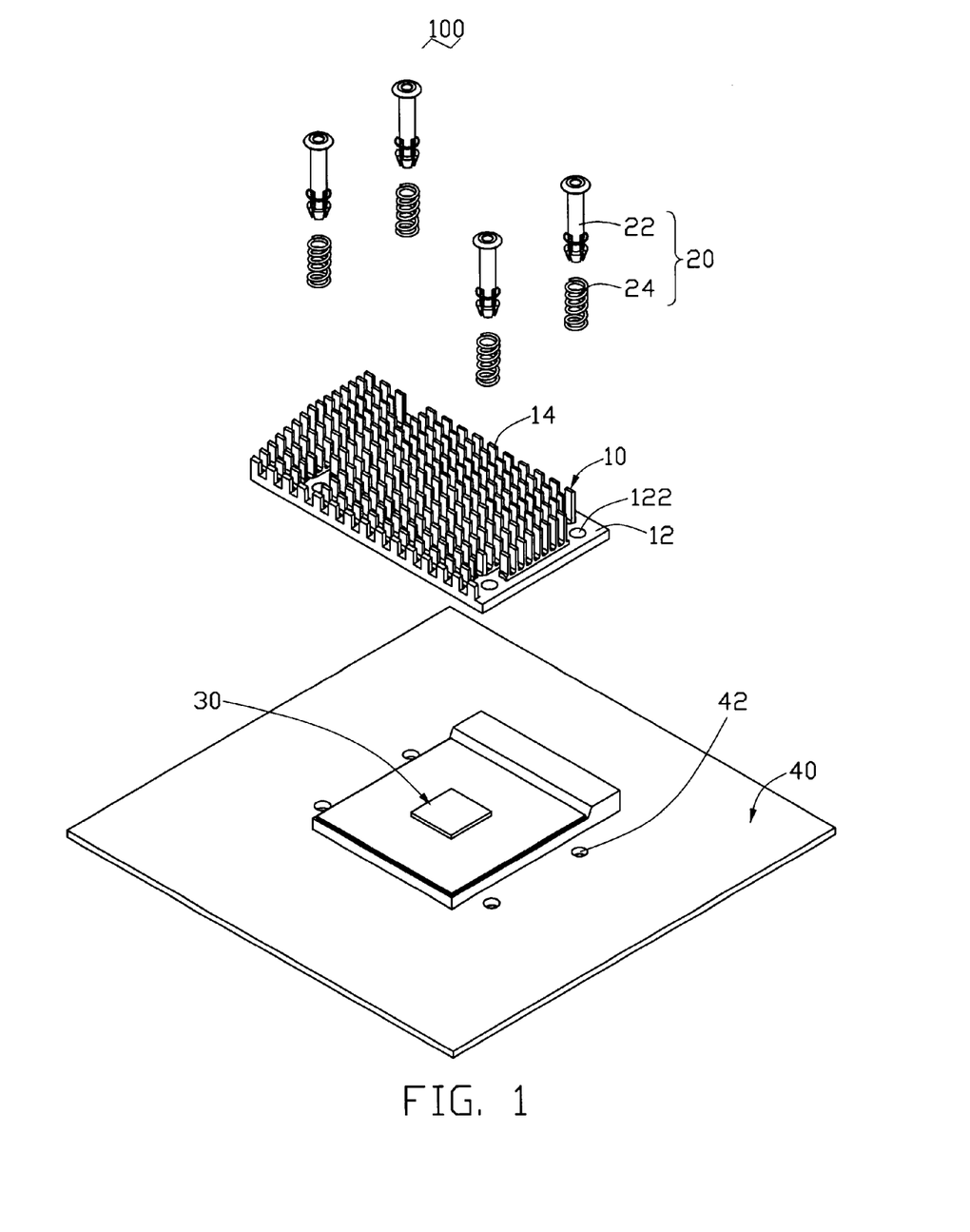
FIG. 1 is an exploded, isometric view of a heat sink assembly in accordance with a first preferred embodiment of the present invention.

Referring to FIG. 1, a heat sink assembly 100 in accordance with a first preferred embodiment of the present invention comprises a heat sink 10, a plurality of clips 20, a heat generating unit 30, and a circuit board 40.

The heat sink 10 comprises a base 12 and a plurality of fins 14 integrally formed with and extending upwardly from the base 12. The base 12 has a plate-type structure, and defines four through holes 122 at four corners thereof for extension of the clips 20.

The heat generating unit 30 is mounted on the board 40 via a socket (not labeled). The board 40 has four holes 42 which are disposed adjacent to and surrounding the heat generating unit 30.

Figure 2:
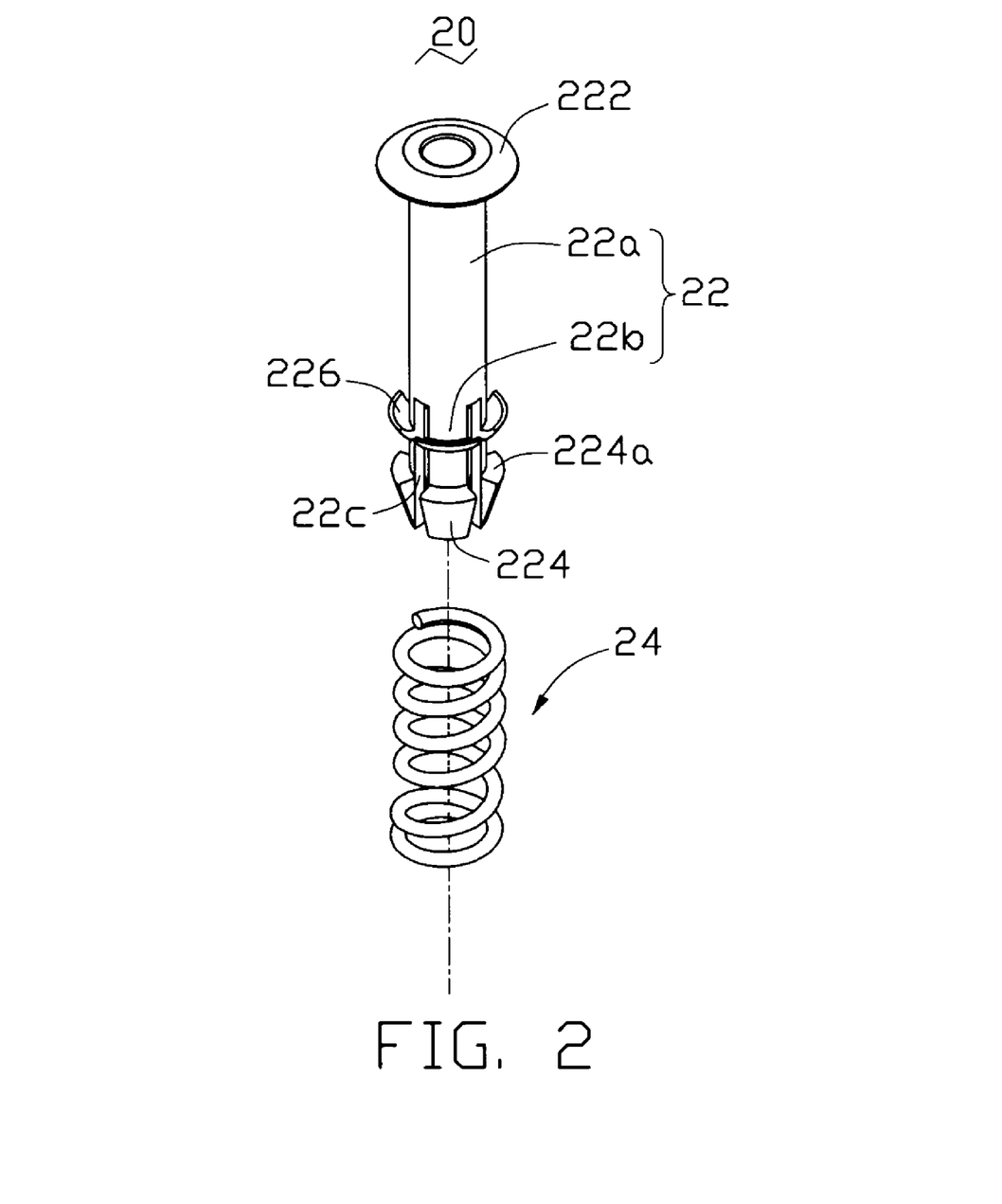
FIG. 2 is an exploded, isometric view of a clip of the heat sink assembly of FIG. 1.
Figure 3:
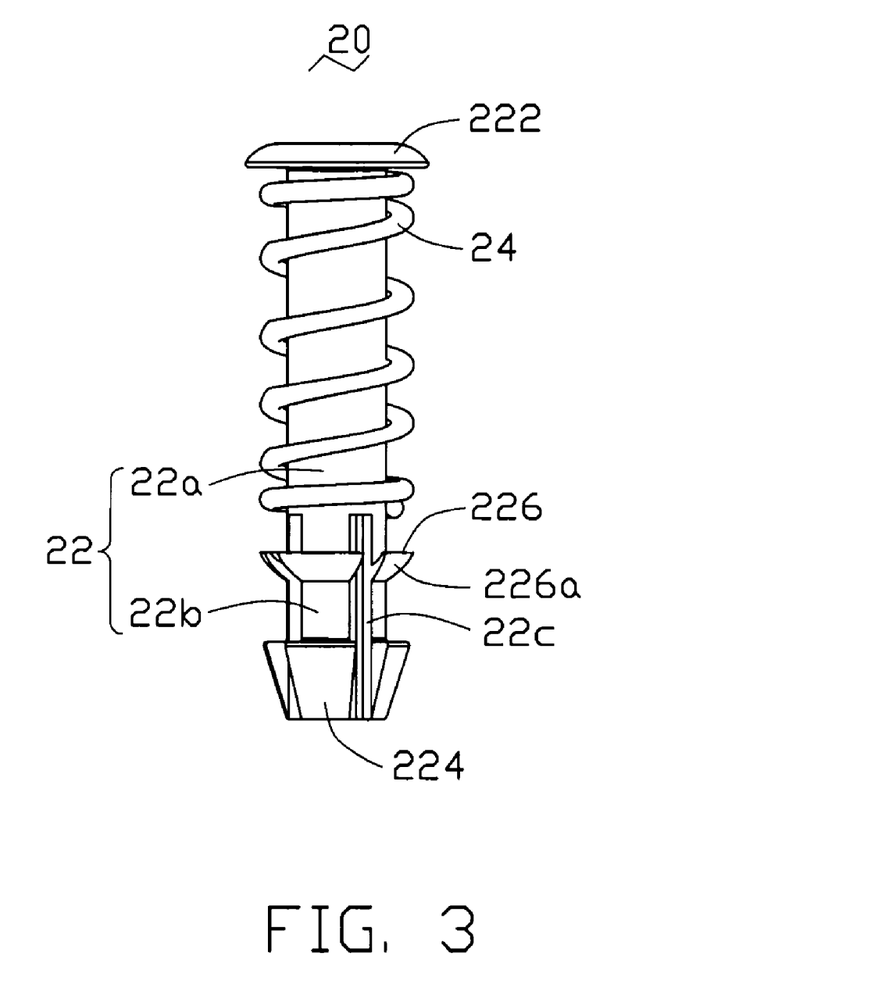
FIG. 3 is an assembled, side view of the clip of FIG. 2.

Referring to FIG. 2 and FIG. 3, each clip 20 comprises an elongated pin 22 and a coil spring 24. The pin 22 typically is made of plastic material, and has a hollow, tubular structure (referring to FIG. 7). The pin 22 comprises an upper section 22a and a lower section 22b below the upper section 22a. A top end of the upper section 22a is provided with an enlarged head 222. The spring 24 is dimensioned to loosely fit around the upper section 22a, and contacts the head 222 of the pin 22 when installed on the pin 22. A clamping portion 224 is formed on a bottom end of the lower section 22b. The clamping portion 224 is generally conical and points downwardly, and a maximum outer diameter of the clamping portion 224 is larger than that of the upper section 22a of the pin 22. An annular abutting portion 226 is formed on the lower section 22b of the pin 22, and is located between the head 222 and the clamping portion 224. The abutting portion 226 is in the form of an annular flange extending radially outwardly from an outer surface of the lower section 22b of the pin 22. The abutting portion 226 has an elastic nature, and arcs towards the head 222 as it extends radially outwardly from the pin 22 so that an arc-shaped outer surface 226a is provided in order to facilitate insertion of the pin 22 into the holes 122 of the heat sink 10. The arc-shaped outer surface 226a faces downwardly. A maximum diameter of the abutting portion 226 is larger than that of the holes 122 of the heat sink 10. Four elongated slots 22c extend from the clamping portion 224 towards the upper section 22a of the pin 22 and communicate with an interior of the hollow pin 22. The abutting portion 226 and the clamping portion 224 are each divided into four parts by the four slots 22c which are equidistantly spaced from each other. As a result, the abutting portion 226 and the clamping portion 224 are each endowed with sufficient flexibility and therefore can be deformed easily when each of them is compressedly extended through the holes 122 of the heat sink 10. After the clamping portion 224 or the abutting portion 226 extends through the holes 122, the compressed status is released, and the clamping portion 224 or the abutting portion 226 will return to its original position. A top end of the clamping portion 224 defines a horizontal abutting surface 224a, and the maximum outer diameter of the clamping portion 224 is larger than that of the holes 42 of the board 40 so that the abutting surface can engage with a bottom surface of the board 40.

Figure 4:
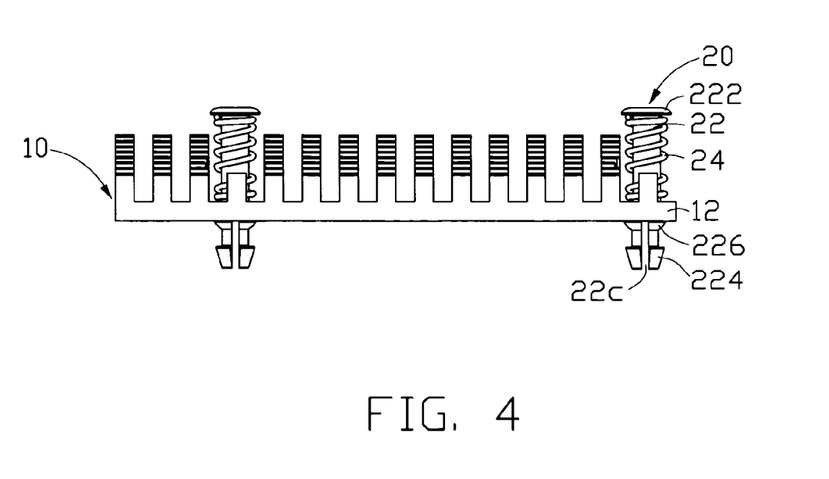
FIG. 4 is a side view of the heat sink assembly of FIG. 1 before it is secured to a circuit board thereof.

Referring to FIG. 1 to FIG. 4, in order to install the clip 20 onto the heat sink 10, the spring 24 is firstly disposed around the pin 22, and located between the head 222 and the abutting portion 226. The head 222 of the clip 20 is pushed so that the clamping portion 224 and the abutting portion 226 are sequentially inserted into and pass through the hole 122 of the heat sink 10. When the abutting portion 226 has passed through the hole 122, the abutting portion 226 returns to its original position, and contacts with a bottom surface of the base 12 of the heat sink 10. At this time, the spring 24 is slightly compressed between the head 222 and a top surface of the base 12 of the heat sink 10, to thereby secure the clip 20 to the heat sink 10 beforehand (as shown in FIG. 4).

Figure 5:
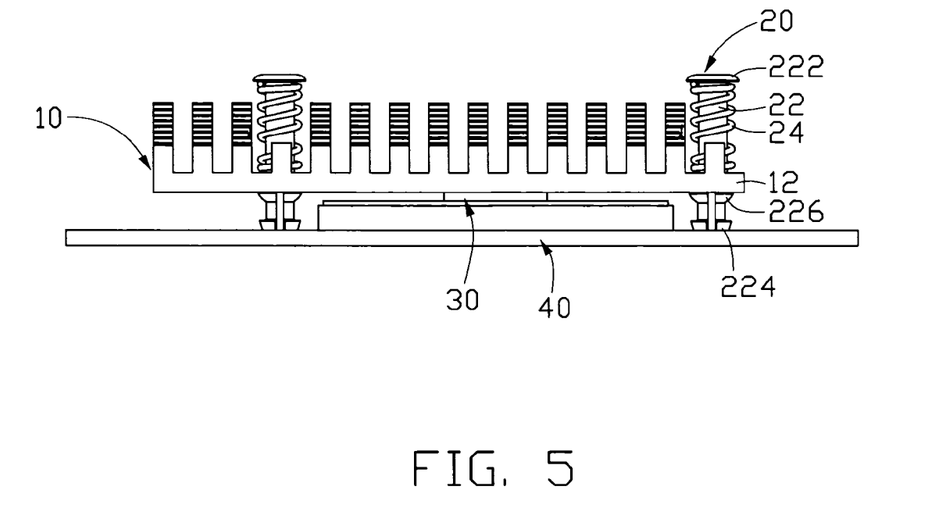
FIG. 5 is similar to FIG. 4, but showing the heat sink assembly is ready to be secured to the circuit board.
Figure 6:
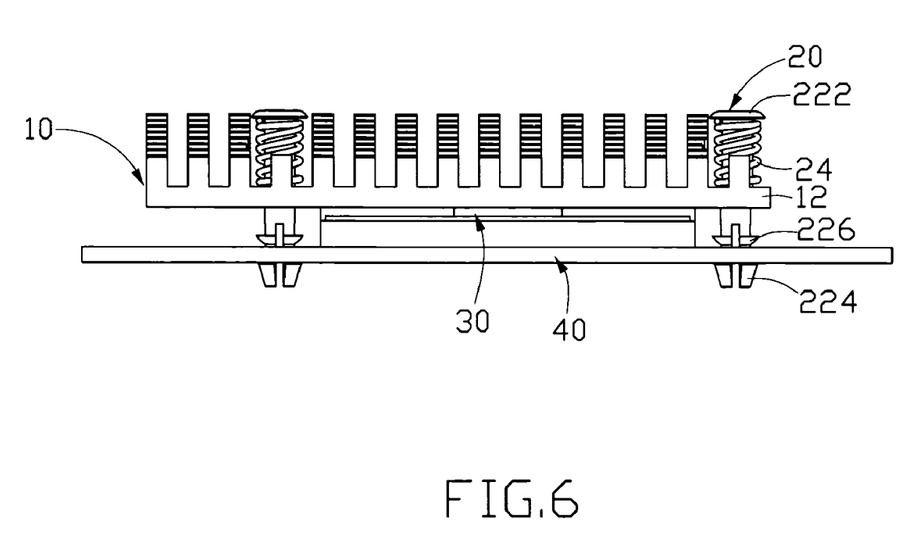
FIG. 6 is similar to FIG. 5, but showing the heat sink assembly secured to the circuit board.
Figure 7:
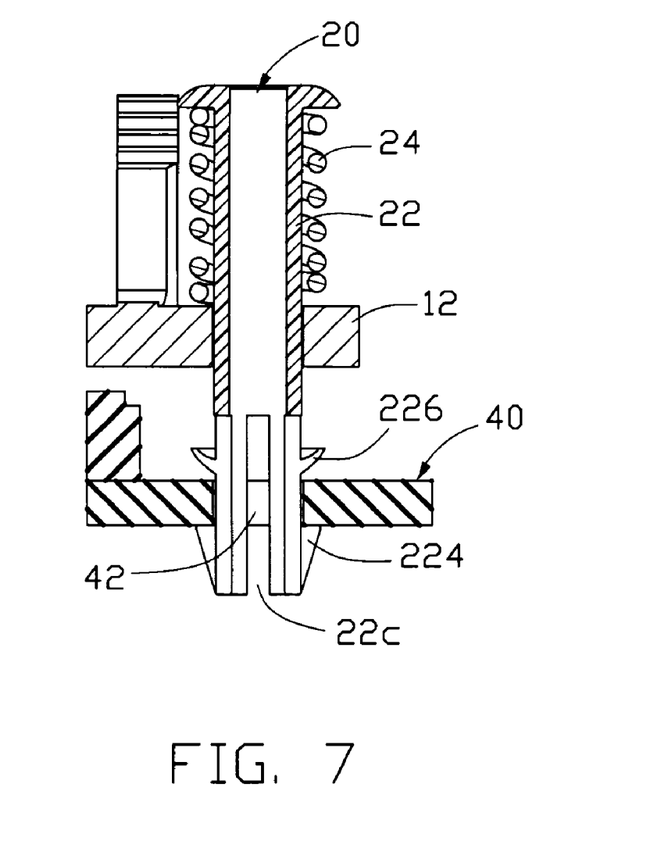
FIG. 7 is a cross-sectional view of a portion of FIG. 6.
Figure 8:
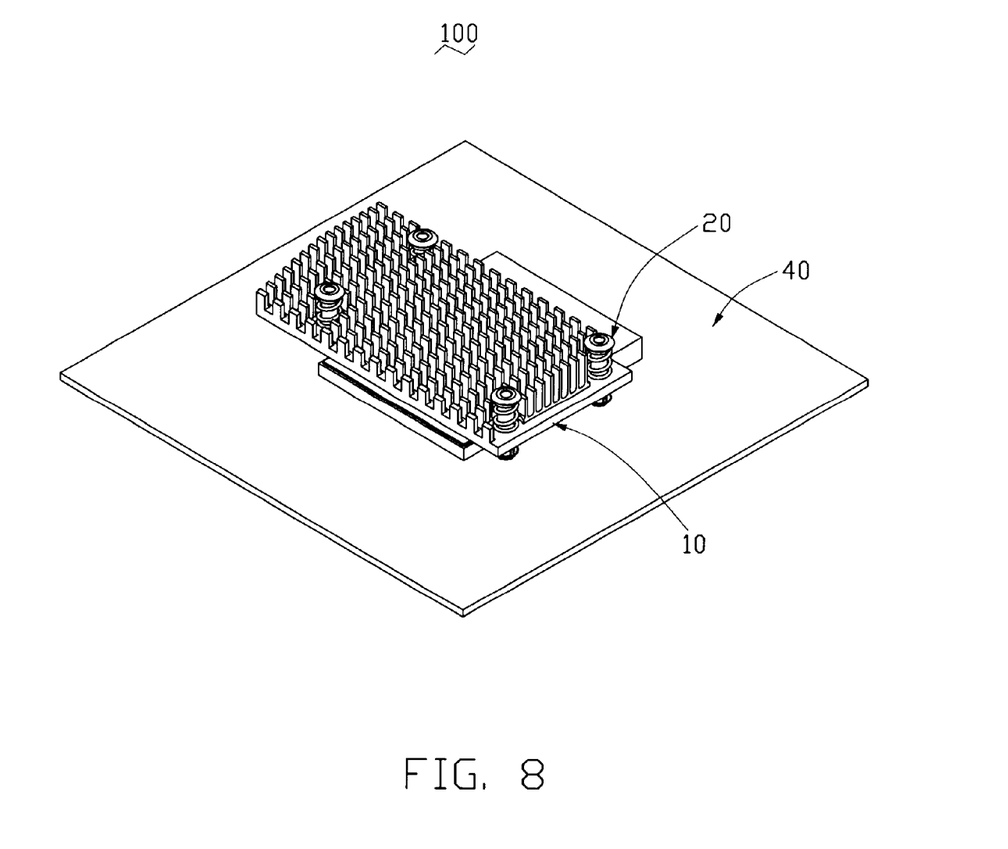
FIG. 8 is an assembled, isometric view of the heat sink assembly of FIG. 1.

To install the heat sink 10 with the clip 20 to the board 40, the base 12 of the heat sink 10 is placed on the heat generating unit 30. The clips 20 are aligned with the holes 42 of the board 40, and a bottom portion of the clamping portion 224 of the pin 22 of each clip 20 is partially received in the holes 42 of the board 40, as shown in FIG. 5. Referring to FIG. 6 to FIG. 8, the head 222 of the clip 20 is further pushed downwardly to cause the clamping portion 224 to insert into and pass through the corresponding hole 42 of the board 40. When the clamping portion 224 of the pin 22 has passed through the hole 42, the clamping portion 224 returns to its original position and the abutting surface 224a of the clamping portion 224 engages with the bottom surface of the board 40 to prevent withdrawal of the clip 20, thereby attaching the heat sink 10 to the heat generating unit 30, as shown in FIG. 7. At this time, the abutting portion 226 stands freely.

From the above description of the embodiment of the present invention, the clips 20 can be preassembled to the heat sink 10 before the heat sink 10 is finally mounted to the heat generating unit 30 mounted on the board 30 by the abutting portion 226 provided to the clip 20.

Figure 9:
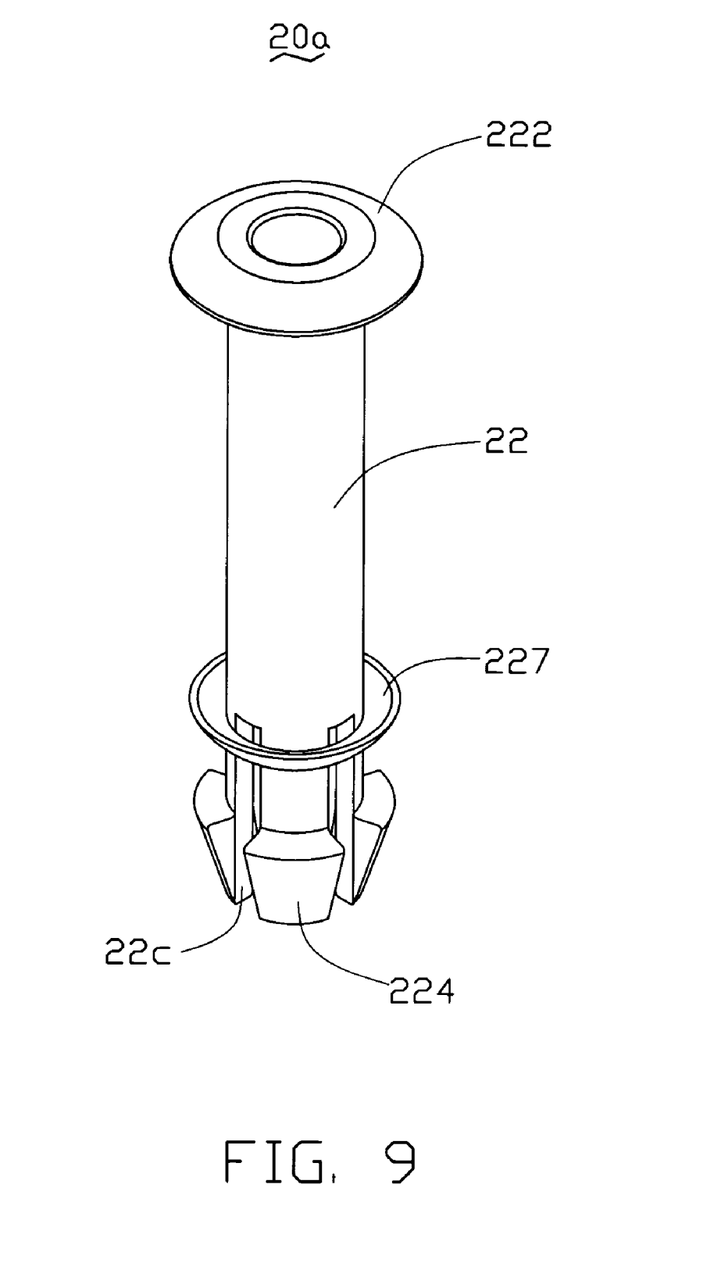
FIG. 9 is a heat sink clip in accordance with a second preferred embodiment of the present invention.

FIG. 9 shows a second preferred embodiment of the heat sink clip of the present invention. To enhance the mechanical strength of the abutting portion 226 of the clip 20 shown in the first embodiment, the abutting portion 227 in this embodiment is an integral one and is not divided by the slots 22c which divide the clamping portion 224 into four parts. Thus, the abutting portion 227 has a continuous, loop structure. Therefore, the abutting portion 227 can resist a larger restoring force exerted by the spring 24 which is compressed when the clip 20a is preassembled to the heat sink 10. Other structures of the clip 20a of the second preferred embodiment are the same as those of the first preferred embodiment.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink clip comprising:
a pin having an upper section and a lower section;
a spring being disposed around said pin;
the upper section of said pin having a head thereon, the lower section of said pin having a clamping portion thereon, an abutting portion being formed between the head and the clamping portion, the spring being located between the head and the abutting portion, the abutting portion being in the form of an annular flange extending radially outwardly from an outer surface of said pin, a plurality of slots being defined through the clamping portion and the lower section of said pin.

2. The heat sink clip as described in claim 1, wherein said pin is made of plastic material.

3. The heat sink clip as described in claim 1, wherein said pin has a tubular, hollow structure.

4. The heat sink clip as described in claim 1, wherein said clamping portion has a conical profile pointed away from the head of said pin.

5. The heat sink clip as described in claim 1, wherein the abutting portion is arced towards the head of said pin and has an arc-shaped outer surface.

6. The heat sink clip as described in claim 1, wherein the slots are equidistantly spaced from each other along a longitudinal direction of said pin, and the abutting portion is divided into a plurality of parts by the slots.

7. The heat sink clip as described in claim 1, wherein the abutting portion has a continuous, loop structure around said pin.

8. A heat sink assembly comprising:
a heat sink defining at least a hole therein;
at least one clip comprising a pin and a spring being disposed around the pin, a top end of said pin having a head thereon, a bottom end of said pin having a clamping portion thereon adapted for engaging with a circuit board, an abutting portion being formed between the head and the clamping portion, the spring being located between the head and the abutting portion, the abutting portion being in the form of an annular flange extending radially outwardly from an outer surface of said pin, the abutting portion of said pin being capable of deformably passing through the at least a hole of said heat sink and abutting against a bottom surface of the heat sink when the abutting portion has passed though the at least a hole of said heat sink, wherein the spring is compressed between the head of said pin and the heat sink.

9. The heat sink assembly as described in claim 8, wherein said pin is made of plastic material, and has a tubular, hollow structure.

10. The heat sink assembly as described in claim 8, wherein the abutting portion has an arc-shaped outer surface.

11. The heat sink assembly as described in claim 8, wherein a plurality of slots is defined through the clamping portion and a lower section of said pin and the abutting portion is divided into a plurality parts by the slots.

12. The heat sink assembly as described in claim 8, wherein the clamping portion is conical and has a pointed end portion formed at an extremity of the bottom end of said pin.

13. A heat sink assembly comprising:
a circuit board;
a heat generating unit mounted on the circuit board;
a heat sink;
a plurality of clips attached to the heat sink, each of the clips including a pin and a spring surrounding the pin;
wherein the pin has a top head, a bottom clamping portion for extending through the circuit board and engaging a bottom of the circuit board so that the heat sink is secured to the heat generating unit, and an abutting portion between the head and the clamping portion, and wherein the abutting portion engages a bottom of the heat sink and the spring is located between the top head and the heat sink before the clamping portion is extended through the circuit board to engage with the bottom of the circuit board.

14. The heat sink assembly as described in claim 13, wherein the clamping portion has at least a slot extending longitudinally therethrough.

15. The heat sink assembly as described in claim 13, wherein the abutting portion is in a form of an annular flange extending radially outwardly from an outer surface of the pin.

16. The heat sink assembly as described in claim 15, wherein the pin has at least a slot extending longitudinally through the clamping portion and the abutting portion.

* * * * *